United States Patent
Cadigan et al.

(10) Patent No.: US 10,157,672 B2
(45) Date of Patent: Dec. 18, 2018

(54) SRAM BITLINE EQUALIZATION USING PHASE CHANGE MATERIAL

(71) Applicant: International Business Machines Corporation, Armonk, NY (US)

(72) Inventors: David D. Cadigan, Danbury, CT (US); William V. Huott, Holmes, NY (US); Adam J. McPadden, Underhill, VT (US); Anuwat Saetow, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/810,290

(22) Filed: Nov. 13, 2017

(65) Prior Publication Data

US 2018/0308545 A1   Oct. 25, 2018

Related U.S. Application Data

(63) Continuation of application No. 15/496,114, filed on Apr. 25, 2017.

(51) Int. Cl.
*G11C 11/412* (2006.01)
*G11C 13/00* (2006.01)
*G11C 14/00* (2006.01)
*G11C 29/12* (2006.01)
*G11C 11/419* (2006.01)

(52) U.S. Cl.
CPC ........ *G11C 13/0069* (2013.01); *G11C 11/419* (2013.01); *G11C 13/0004* (2013.01); *G11C 14/009* (2013.01); *G11C 29/12* (2013.01); *G11C 11/412* (2013.01); *G11C 2029/1204* (2013.01)

(58) Field of Classification Search
CPC .... G11C 11/419; G11C 11/413; G11C 11/412
USPC ........................ 365/189.05, 230.08, 148, 163
See application file for complete search history.

(56) References Cited

U.S. PATENT DOCUMENTS

| | | | | |
|---|---|---|---|---|
| 5,091,879 A | * | 2/1992 | Tran | ...................... G11C 11/419 |
| | | | | 327/52 |
| 6,788,095 B1 | * | 9/2004 | Mark | .................. G01R 31/3008 |
| | | | | 324/762.03 |
| 6,906,937 B1 | * | 6/2005 | Nataraj | .................. G11C 15/04 |
| | | | | 365/154 |

(Continued)

OTHER PUBLICATIONS

David D. Cadigan, et al., U.S. Appl. No. 15/496,114 entitled "SRAM Bitline Equalization Using Phase Change Material," filed Apr. 25, 2017.

(Continued)

*Primary Examiner* — Jason Lappas
(74) *Attorney, Agent, or Firm* — Cantor Colburn LLP; Bryan Bortnick (57) ABSTRACT

Embodiments include techniques for static random access memory (SRAM) bitline equalization using phase change material (PCM). The techniques include detecting a defect in SRAM bitlines, and programming a variable resistance PCM cell to offset the detected defect. The techniques also include measuring signal development time for the SRAM bitlines, and adjusting the programming of the variable resistance PCM cell based at least in part on the measured signal development for the SRAM bitlines.

5 Claims, 6 Drawing Sheets

600A (56) References Cited

U.S. PATENT DOCUMENTS

| | | | | |
|---|---|---|---|---|
| 7,486,540 | B2 * | 2/2009 | Gouin | G11C 11/419 |
| | | | | 365/154 |
| 7,558,097 | B2 * | 7/2009 | Khellah | G11C 5/063 |
| | | | | 365/154 |
| 7,692,959 | B2 * | 4/2010 | Krusin-Elbaum | |
| | | | | G11C 13/0004 |
| | | | | 365/113 |
| 7,920,397 | B1 * | 4/2011 | Nataraj | G11C 7/12 |
| | | | | 365/49.1 |
| 8,559,248 | B2 * | 10/2013 | Dally | G11C 7/12 |
| | | | | 365/154 |
| 9,171,610 | B2 * | 10/2015 | Choi | G11C 11/419 |

OTHER PUBLICATIONS

List of IBM Patents or Patent Applictions Treated as Related; (Appendix P), Filed Nov. 13, 2017, 2 pages.

* cited by examiner

SRAM BITLINE EQUALIZATION USING PHASE CHANGE MATERIAL

DOMESTIC PRIORITY

This application is a continuation of U.S. patent application Ser. No. 15/496,114, filed Apr. 25, 2017, the content of which is incorporated by reference herein in its entirety.

BACKGROUND

The present invention relates to memory, and more specifically, to SRAM bitline equalization using phase change material (PCM).

Various types of memory devices can be used for different applications. For example, CPU memory and data storage can have different requirements for memory and memory types. One type of memory includes static random access memory (SRAM). A plurality of SRAM cells can be configured in an array orientation for storing a plurality of bits. A second type of memory includes dynamic random access memory (DRAM). DRAMs operate in a different manner, however, DRAMs require the power to be refreshed during operation to maintain a state of the memory cell. DRAMs are volatile memory because the stored data will be lost when power is removed from the memory.

SUMMARY

According to an embodiment of the present invention, a system for static random access memory (SRAM) bitline equalization using phase change material (PCM) is provided. The system includes a SRAM including bitlines and a plurality of transistors, and a pre-charge circuit coupled to the bitlines of the SRAM for pre-charging the bitlines to a high state. The system also includes a sense amplifier for periodically sampling the bitlines and outputting data based on a signal differential of the bitlines, and a variable resistance PCM cell configured based at least in part on a detected defect of a bitline of the SRAM.

According to a different embodiment, a computer-implemented method for static random access memory (SRAM) bitline equalization using phase change material (PCM) is provided. The method includes detecting a defect in SRAM bitlines and programming a variable resistance PCM cell to offset the detected defect. The method also includes measuring signal development time for the SRAM bitlines, and adjusting the programming of the variable resistance PCM cell based on the measured signal development for the SRAM bitlines.

According to a different embodiment, a computer program product for static random access memory (SRAM) bitline equalization using phase change material (PCM) is provided. The computer program product includes a computer readable storage medium having stored thereon first program instructions executable by a processor to cause the processor to detect a defect in SRAM bitlines, and program a variable resistance PCM cell to offset the detected defect. The instructions are further executable to cause the processor to measure signal development time for the SRAM bitlines, and adjust programming of the variable resistance PCM cell based at least in part on the measured signal development for the SRAM bitlines.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

In accordance with exemplary embodiments of the disclosure, methods, systems and computer program products for static random access memory (SRAM) bitline equalization using phase change material (PCM).

The techniques described herein are used to improve signal development reliability in SRAM cells. In particular, the bitlines of SRAM cells can experience signal leakage which affects the reliability of the signal differential between them when sampled to produce output signals. The unwanted signal leakage on the bitline reduces the signal delta between the bitlines that are coupled to the SRAM cell when sampled by the sense amplifier. Although all defects do not cause errors in the data retrieved from the SRAM cell, the reliability of the data can be improved. In one or more embodiments, a variable resistance phase change material cell can be programmed and coupled to the bitlines to compensate for a detected signal leakage. In addition, a technique for identifying the bitlines of a SRAM experiencing signal leakage and offsetting its effects is provided.

Figure 1:
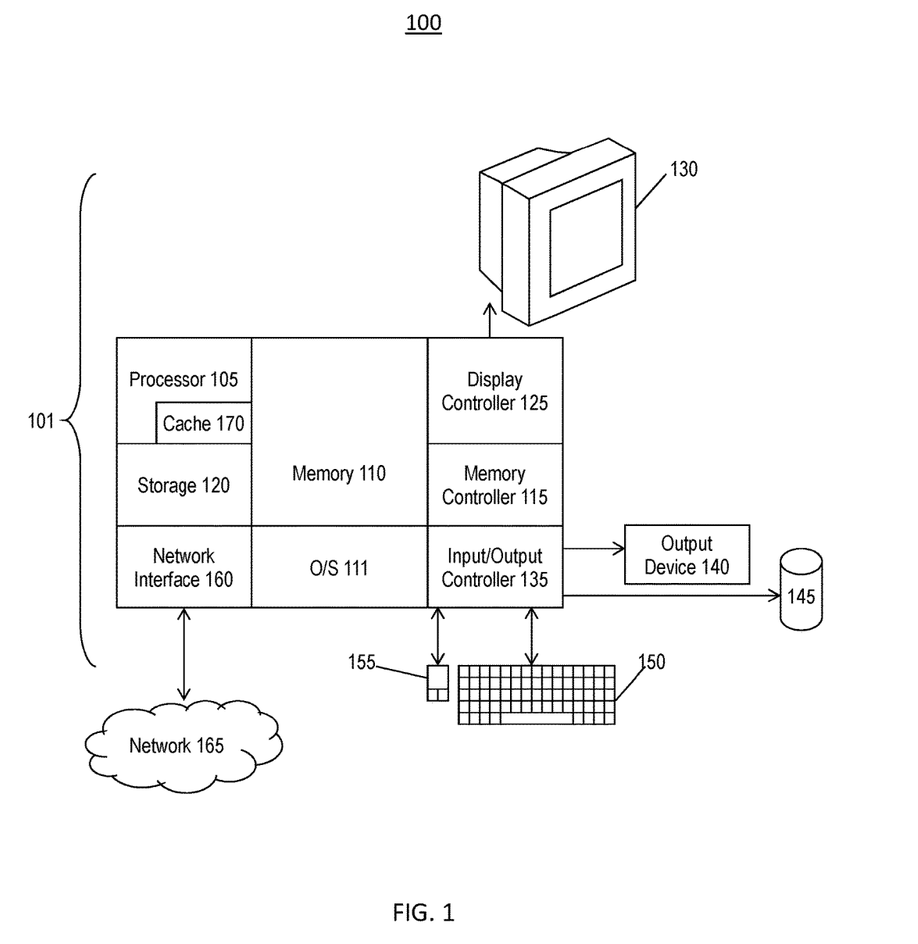
FIG. 1 is a block diagram illustrating one example of a processing system for practice of the teachings herein.

In an exemplary embodiment, in terms of hardware architecture, as shown in FIG. 1, the computer 101 includes a processor 105. The computer 101 further includes memory 110 coupled to a memory controller 115, and one or more input and/or output (I/O) devices 140, 145 (or peripherals) that are communicatively coupled via a local input/output controller 135. The input/output controller 135 can be, for example, but not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 105 is a hardware device for executing software, particularly that stored in storage 120, such as cache storage, or memory 110. The processor 105 can be any custom made or commercially available processor, a central processing unit (CPU), an auxiliary processor among several processors associated with the computer 101, a semiconductor based microprocessor (in the form of a microchip or chip set), a macroprocessor, or generally any device for executing instructions.

The memory 110 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, and/or other types of storage media. Note that the memory 110 can have a distributed architecture, where various components are situated remote from one another but can be accessed by the processor 105.

The instructions in memory 110 may include one or more separate programs, each of which comprises an ordered listing of executable instructions for implementing logical functions. The instructions in the memory 110 a suitable operating system (OS) 111. The operating system 111 essentially controls the execution of other computer programs and provides scheduling, input-output control, file and data management, memory management, and communication control and related services.

In an exemplary embodiment, a conventional keyboard 150 and mouse 155 can be coupled to the input/output controller 135. Other output devices such as the I/O devices 140, 145 may include input devices, for example but not limited to a printer, a scanner, microphone, and the like. Finally, the I/O devices 140, 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 100 can further include a display controller 125 coupled to a display 130. In an exemplary embodiment, the system 100 can further include a network interface 160 for coupling to a network 165. The network 165 can be an IP-based network for communication between the computer 101 and any external server, client and the like via a broadband connection. The network 165 transmits and receives data between the computer 101 and external systems. In an exemplary embodiment, network 165 can be a managed IP network administered by a service provider. The network 165 may be implemented in a wireless fashion, e.g., using wireless protocols and technologies, such as WiFi, WiMax, etc. The network 165 can also be a packet-switched network such as a local area network, wide area network, metropolitan area network, Internet network, or another similar type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals. Other networks include body area networks (BAN) where the electric field of a human body can be used to transmit signals.

If the computer 101 is a PC, workstation, intelligent device or the like, the instructions in the memory 110 may further include a basic input output system (BIOS) (omitted for simplicity). The BIOS is a set of essential software routines that initialize and test hardware at startup, start the OS 111, and support the transfer of data among the hardware devices. The BIOS is stored in ROM so that the BIOS can be executed when the computer 101 is activated.

When the computer 101 is in operation, the processor 105 is configured to fetch and execute instructions stored within the memory 110, to communicate data to and from the memory 110, and to generally control operations of the computer 101 pursuant to the instructions.

Figure 7:
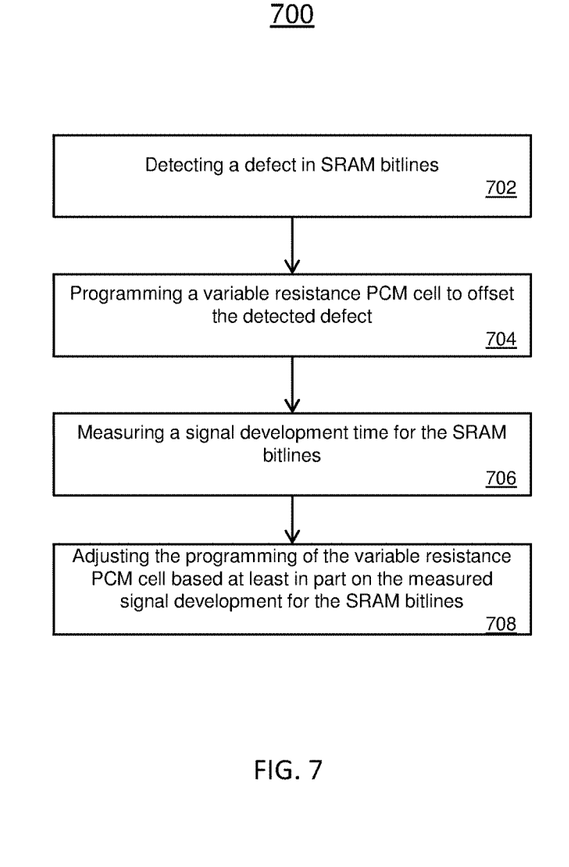
FIG. 7 is a flow diagram illustrating a method for SRAM bitline equalization using PCM in accordance with an embodiment.

In an exemplary embodiment, where the method for SRAM bitline equalization using phase change material PCM is implemented in hardware, the methods described herein, such as processes 700 of FIG. 7, can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 2:
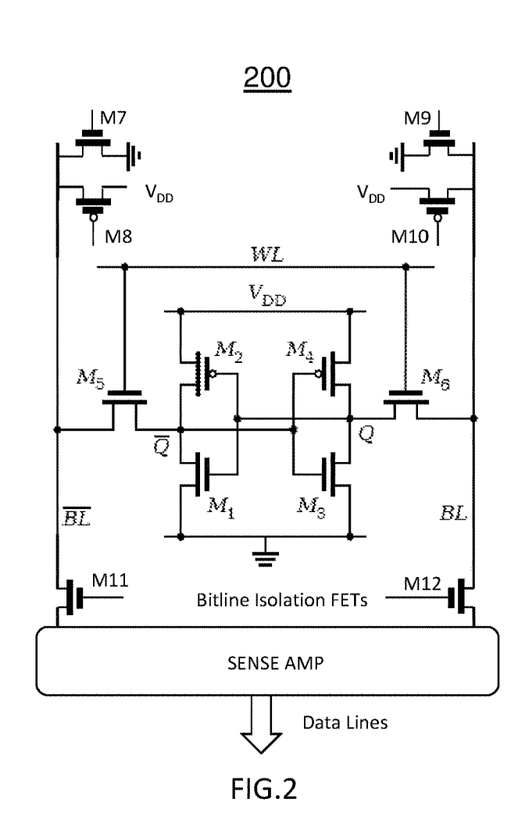
FIG. 2 is a circuit diagram for a six transistor static random access memory (SRAM) with a sense amplifier.

With reference now to FIG. 2, a static random-access memory (SRAM) 200 is provided. The SRAM 200 as shown is a six transistor SRAM including transistors M1-M6. In particular, the transistors M1, M3, M5, and M6 are NFETs while the transistors M2 and M4 are PFETs.

The transistors M5 and M6 are controlled by the wordline WL for connecting the SRAM cell to the bitlines BL and /BL. The transistors M1 and M2 operate as an inverter providing an output /Q which is coupled to the input of the transistors M3 and M4. The transistors M1 and M2 are coupled to each other and can be connected to VDD and ground. Similarly, the transistors M3 and M4 operate as an inverter providing an output Q which is also coupled to the input of the transistors M1 and M2. The transistors M3 and M4 are coupled to each other and can be connected to VDD and ground. The output Q and /Q can be coupled to the bitlines BL and /BL through transistors M5 and M6.

When the transistors M5 and M6 are switched on under the control of the wordline WL the data of the SRAM cell can be accessed. In contrast, when the transistors M5, M6 are switched off, the data of the SRAM cells are not connected to the bitlines and the SRAM cells can hold their current state.

Also shown in FIG. 2 are pre-charge circuits coupled to the bitlines BL, /BL where a first pre-charge circuit includes transistors M7 and M8, and another pre-charge circuit includes M9 and M10. In this example, the pre-charge circuit is configured to ensure the bitlines are held high at the start of the operation. These transistors of the pre-charge circuit can be switched by control signals provided at the gate or base of each transistor. For example, the transistors M7, M8 associated with the bitline /BL can be connected to either ground or VDD, respectively. When /BL is pre-charged to the high state, transistor M7 is switched off while transistor M8 is switched on. Similarly, the pre-charge circuit including transistors M9 and M10 associated with the bitline BL operates in the same manner.

Upon the activation of the wordline WL which controls the transistors M5 and M6, one of the bitlines BL, /BL will begin to slowly discharge. The bitlines BL and /BL provide opposite states.

FIG. 2 also provides a Sense Amplifier (S/A) configured to sample the bitlines BL, /BL to obtain a signal differential for determining an output. In this example, the S/A is coupled to the bitlines through bitline isolation field effect transistors (FET) M11 and M12. In one or more embodiments, the bitline isolation FETs M11 and M12 are not required. After sampling is performed by the S/A, the obtained signal differential is amplified and a digital "1" or "0" state is determined. The data is output to the data lines coupled to the S/A as shown. In one or more embodiments, a plurality of data lines can be used.

A defective leakage existing on the bitline can affect the voltage differential between the bitlines of the SRAM appearing at the S/A making it difficult to determine the proper state of the cell. If the defective leakage is severe enough, the S/A may be set in the wrong direction causing data corruption. In one scenario, a defect can pull a bitline signal down towards ground. In a different scenario, a defect can pull a bitline signal up towards a higher voltage. The technique described herein provides a method to offset the effects of the detected leakage. In one or more embodiments, a variable resistance phase change material cell can be used and programmed to compensate for the signal leakage. In another embodiment, a phase change material PCM can be programmed and operated as a variable resistor.

Figure 3:
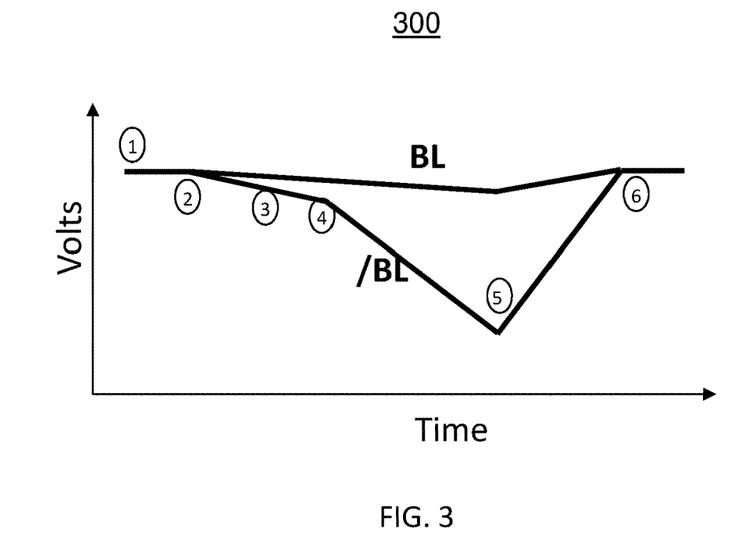
FIG. 3 is a time-voltage chart for a SRAM bitline equalization using phase change material (PCM)

Now referring to FIG. 3, a time-voltage diagram 300 provides a SRAM read bitline cycle. The time-voltage diagram 300 provides an example of a normal read operation where under normal operation the bitlines are not experiencing any signal leakage. At position 1, the first bitline BL and second bitline /BL are pre-charged to a "1" (high) voltage. In one or more embodiments, the bitlines can be pre-charged by a pre-charge circuit, similar to that shown in FIG. 2.

At position 2, the wordline (WL) is activated and connects the bitlines (BL, /BL) to the charge nodes (Q, /Q) of the cell. Q and /Q are of opposite polarity. As shown in FIG. 2, the wordline WL controls the switching of transistors M5 and M6 which connects the SRAM memory cell to the bitlines.

At position 3, the bitline on the "0" side of the SRAM cell will get pulled down towards ground. This bitline gets pulled down faster than the opposite bitline due to the cell's NFET pull-down path and the current state of the cell.

Position 4 represents a signal development time to allow for bitline separation between the two bitlines. After the signal development period, the S/A will sample the bitlines and "set" a state based on the detected bitline differential. The impact of signal leakages in the bitlines can affect the realized bitline differential at the S/A. In one or more embodiments, the S/A can be triggered by a sense amplifier clock. The bigger the differential at step 4 the more reliable the data. The more time it takes for the signal to get to step 4, the longer the delay in processing the signals.

At position 5, the S/A are fully "set", BL and /BL are at their respective set values and their data can be driven off chip. Following this, the S/A may be isolated from the bitlines to begin the pre-charge sequence. In one or more embodiments, absolute isolation is not required. In a different embodiment, isolation can be performed. At position 6 the bitlines are returned to the pre-charged state.

Figures 4, 5A, 5B:
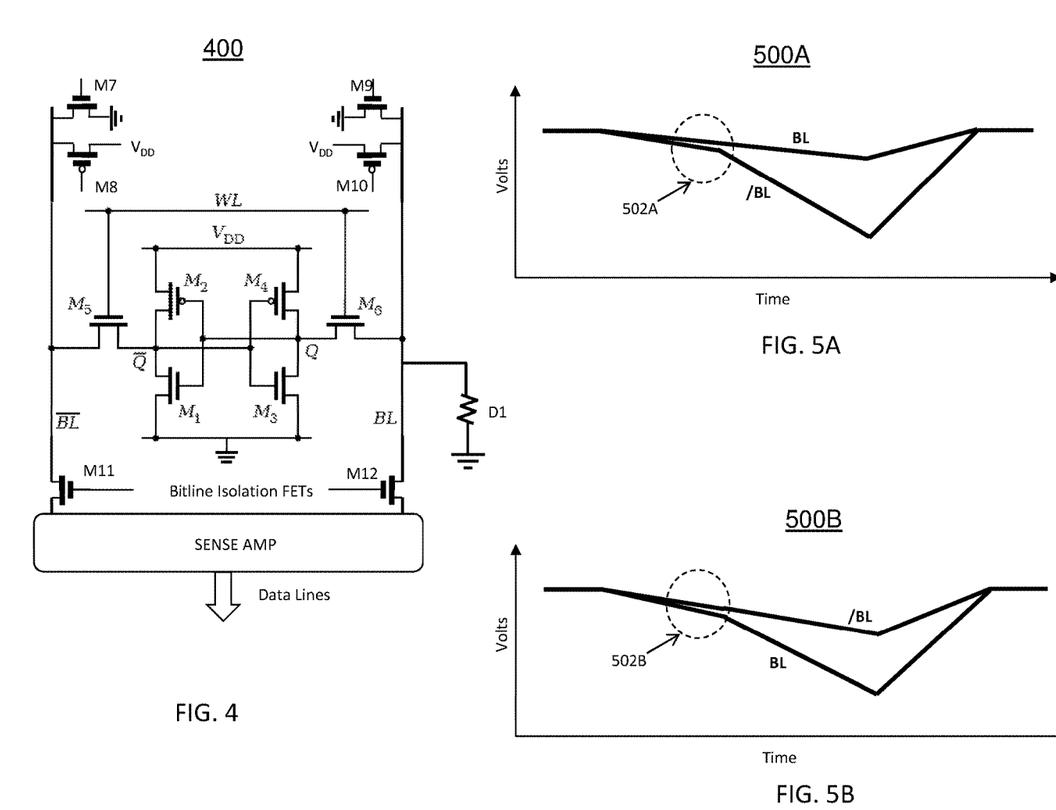
FIG. 4 is a circuit diagram for a SRAM bitline equalization using PCM.
FIGS. 5A and 5B are time-voltage charts for a SRAM bitline equalization using PCM.

Now referring to FIG. 4, a SRAM 400 similar to SRAM 200 of FIG. 2 is shown. The SRAM 400 as shown is experiencing a signal defect D1. In this example, the bitline BL is experiencing a defect D1 which pulls the bitline BL signal towards ground. In other examples, the bitline BL signal can be pulled up. This can affect the bitline differential sampled by the S/A causing an incorrect state to be set.

Now referring to FIG. 5A, a time-voltage diagram 500A for a SRAM is provided. The diagram 500A provides a scenario where bitline BL has experienced a signal leakage. However, in this example, the S/A was "set" in the correct state based on the signal differential of the bitlines at position 4. For example, a bitline BL may experience a signal leakage to ground pulling the signal of the bitline down. The defect can cause the S/A to "set" in the wrong state. As shown in FIG. 3, location 4 of the time-voltage diagram 500A, indicated as 502A in the time-voltage diagram 500A, provides the S/A samples the bitlines after the signal development period. At location 502A the S/A will sample the bitlines. In this scenario, given the voltage differential between the bitlines BL and /BL the S/A has set the state correctly, although the bitline BL has experienced signal leakage.

Now referring to FIG. 5B, a time-voltage diagram 500B is provided. The time-voltage diagram 500B provides a scenario where the signal leakage of the bitline BL is so severe that it causes the signal to drop or be pulled below that of /BL. At point 4, indicated as 502B in the time-voltage diagram 500B, the sense amp will sample the differential between the bitlines and provide an output based on the signal differential. In this scenario, the signal leakage has resulted in the S/A sampling the bitlines BL and /BL setting in the wrong direction due to the leakage. The techniques described herein provide a method to offset the effects of the detected leakage.

Figure 6A:
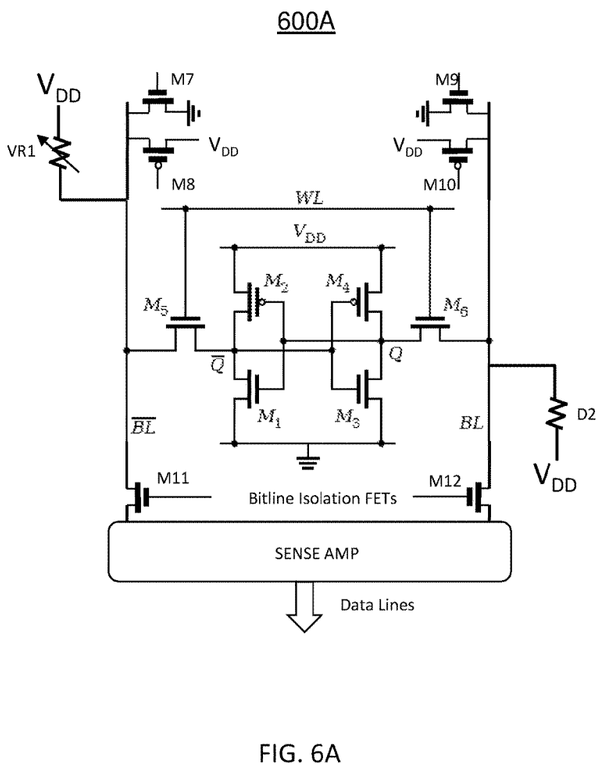
FIGS. 6A and 6B are circuit diagrams for a SRAM bitline equalization using PCM in accordance with one or more embodiments.

Now referring to FIG. 6A, a SRAM bitline equalization using PCM in accordance with one or more embodiments is provided. The system 600A includes a six transistor SRAM similar to the SRAM shown in FIG. 2. The SRAM as shown includes a defect D2 illustrating a signal for the bitline BL is pulled up to a higher voltage. The SRAM also includes a variable resistance phase change cell VR1 connected to the bitline /BL. In this example, the VR1 is connected to the bitline /BL in order to elevate the signal of the bitline /BL based on the defect D2. The VR1 is programmed to offset the effects of the defect D2. The variable resistance phase change cell VR1 includes phase change material that can be programmed to offset the defect of D2. In one or more embodiments, the PCM is chalcogenide. Phase changed devices allow the materials to be changed between crystalline and amorphous states. By changing the physical structure of the material one or more parameters such as resistance can be changed.

In one or more embodiments, the PCM is operated as a variable resistance PCM cell. The intermediate stages of the PCM have different states that can be programmed to offset the defect among the bitlines. In one or more embodiments, the variable resistance PCM cell can be programmed by applying a voltage to the PCM to control the voltage drop across the PCM. The PCM can be programmed to offset the signal leakage from a defect of the bitline.

The variable resistance PCM cell VR1 as shown is connected to VDD with the other end being coupled to the bitline /BL. The VR1 is provided a path to ground through the transistor M7. The VR1 is also provided a path to the voltage rail VDD through the transistor M8. In this example, to offset the effects of the defect D2, VR1 will be provided a path to voltage VDD through the transistor M8 to offset the defect.

In one or more embodiments, the variable resistance PCM cell VR1 can be connected and controlled by existing circuit elements such as the pre-charge circuit. In a different embodiment, the variable resistance PCM cell can be connected and controlled by a dedicated transistor of the circuit.

Figure 6B:
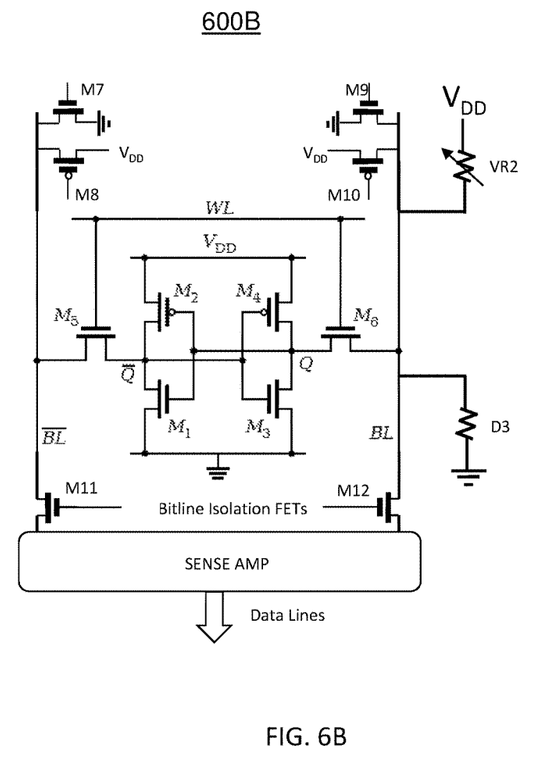

Now referring to FIG. 6B, a SRAM bitline equalization using PCM in accordance with another embodiment is provided. The system 600B includes a six transistor SRAM similar to the SRAM shown in FIG. 2. The SRAM as shown includes a defect D3 illustrating a signal for the bitline BL is pulled down towards ground. In this example, the VR2 is positioned on the bitline BL experiencing the defect D3 and is programmed to offset the effects of the defect D3. In one or more embodiments, the variable resistance PCM cell can be positioned on bitlines BL and /BL and can be activated by controlling the gate voltages of the associated transistors as needed to offset a signal leakage.

Now referring to FIG. 7, a method 700 for SRAM bitline equalization using PCM in accordance with an embodiment is shown. Block 702 provides detecting a defect in SRAM bitlines. In one or more embodiments, a signal defect can be determined by the test mode of a memory cell described below. Signal defects include those that pull signals up and those that pull signals down. Other methods and techniques can be used to determine the signal leakage.

Block 704 provides programming a variable resistance PCM cell to offset the detected defect. The PCM is programmed by configuring the voltage drop across the PCM. In one or more embodiments, the variable resistance PCM cell is programmed by applying a voltage that is included the circuit. The location of the variable resistance PCM cell can be positioned on a first bitline and/or a second bitline. In addition, the variable resistance PCM cell can be activated on the first bitline and/or the second bitline based on the signal defect pulling a signal up or pulling the signal down. For example, for a bitline having a defect that is pulling the bitline signal down, a variable resistance PCM cell can be coupled to the bitline and programmed to pull the bitline signal up. In a different example, for a bitline having a defect that is pulling the bitline signal up, a variable resistance PCM cell can be coupled to the opposite bitline and programmed to pull the opposite bitline (bitline opposite the bitline experiencing the defect) signal up.

In another embodiment, where a bitline has a defective leakage to VDD, a PCM located on the opposite bitline can be tuned to match the pull-up leakage. In an example, referring to FIG. 6A transistor M8 can be used to provide a current path from VDD to offset a defect. In this arrangement, the pre-charge VDD can be configured to a higher voltage. In a different example, if the defective leakage to VDD occurs on bitline /BL, the opposite bitline can use a transistor to provide a current path to VDD.

Block 706 provides measuring a signal development time for the SRAM bitlines. The signal development time is the interval of time provided after the activation of the wordline for the signal separation to be realized by the S/A.

Block 708 provides adjusting the programming of the variable resistance PCM cell based at least in part on the measured signal development for the SRAM bitlines. In one or more embodiments, if the measurement including the variable resistance phase change cell activated does not bring the performance of the bitline within an expected range (described below), the PCM values can be modified accordingly to bring the performance of the bitline within the expected range. The process can be repeated until a desirable performance level (based on an initial test) is achieved.

Figure 8:
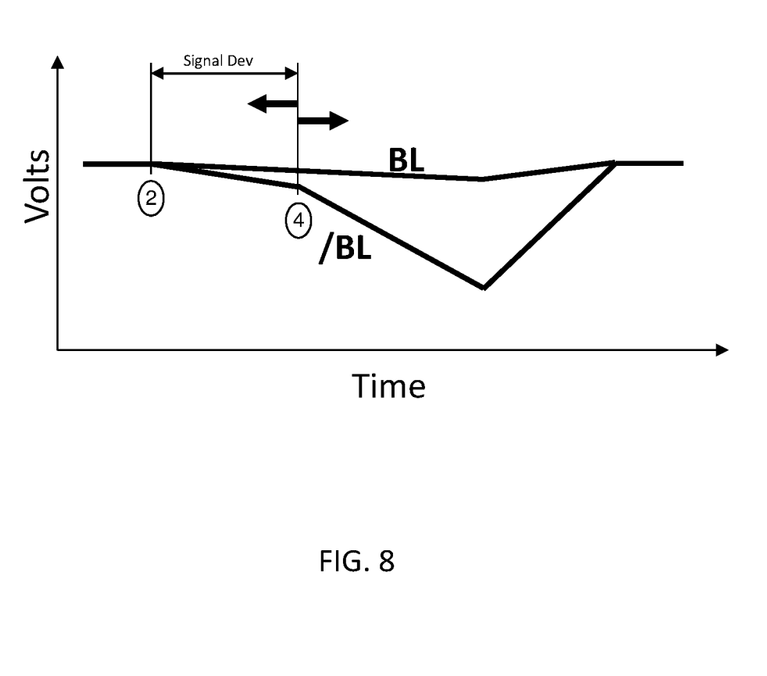
FIG. 8 is a diagram of a test mode for SRAM bitline equalization using PCM.

Now referring to FIG. 8, a time-voltage diagram 800 for testing sense amplifier "SET" time test mode is provided. In one or more embodiments, the memory chips having one or more SRAM cells can be equipped with a test mode to vary the time a sense amplifier's period for performing SET operation. The period of time can be varied to require less time, shown by the arrow pointing to the left, to trigger the SET operation when reading the differential between the bitlines. An initial test can be performed for an array of a plurality of memory cells to determine a normal distribution of its performance. The signal deviation is measured between position 2 where the wordline is activated connecting the bitlines to the memory cell and position 4 at the time the S/A will "set" a state based on the bitline differential. During the test mode, the sample time can be reduced forcing the S/A to determine a state with less signal provided from the bitlines. The signal development time can be continually reduced until a failure is realized. This time value at the point of failure can be used to determine a distribution for the performance of the bitlines of the cells where the distribution can indicate which bitlines may be experiencing a signal line defect.

The test can be performed to determine a signal development time for a set of bitlines where an appropriate signal development time allows for the bitline separation at the S/A prior to setting a state.

After a signal development period has been determined the distribution of the behavior for normal cells of array of an SRAM can be analyzed. The distribution can reveal the bitlines that are performing as expected based on the technology and design as well as the bitlines of the underperforming cells. After the distribution has been analyzed the outlier bitlines relative to the distribution can be identified. The outlier bitlines are those bitlines that fail prematurely relative to the normal array distribution (target candidate). An example of a failure is where the bitlines BL and /BL are reversed during the signal development period and an incorrect state is set by the S/A. The outlier bitlines can be used for target abnormal candidates for programming the PCM of the variable resistance PCM cell.

After the target candidates are determined, the variable resistance PCM cell can be programmed to a slightly conductive state for the target abnormal candidate bitlines. This will allow the PCM to provide a signal to offset the defects experienced by the bitlines.

After the PCM has been programmed the signal development time using the variable resistance PCM cell can be measured again for the target abnormal candidate bitline to determine the effect of the variable resistance PCM cell. The programming of the variable resistance PCM is verified for operation.

Based on the measurement, the voltage values that are used to program the PCM can be incremented to achieve an acceptable signal development time. In one or more embodiments, the acceptable signal deviation for the signal development time is determined based on being within the range of the normal distribution determined in the initial testing step. The signal deviation is determined to be acceptable when a signal deviation that falls within the normal distribution. In an embodiment, the incremented values can vary by technology and design. If after the measurement the target abnormal candidate bitlines fall within the acceptable range, the values will be recorded.

In one or more embodiments, a table can be developed to store the recommended PCM programming levels based on an experienced signal defect to achieve an expected signal development time. These programming levels can be subsequently used to program a variable resistance PCM cell for operation. The PCM programming levels can vary based on the memory types and technology used to implement the memory. The memory types and technology can also be stored in the table for recommending the PCM programming levels.

The techniques described here provide a mechanism to compensate for unwanted leakage on SRAM bitlines. Using a small programmable PCM device to rebalance the leakage characteristics of a bitline pair will improve signal development reliability, lower bit error rate due to the bitline imbalances, and allow redundant elements to be used elsewhere.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for static random access memory (SRAM) bitline equalization using phase change material (PCM), the method comprising:
   detecting a defect in SRAM bitlines;
   programming a variable resistance PCM cell to offset the detected defect;

measuring signal development time for the SRAM bitlines; and adjusting the programming of the variable resistance PCM cell based at least in part on the measured signal development time for the SRAM bitlines, wherein an existing transistor of the SRAM is coupled to the variable resistance PCM cell for offsetting the defect, wherein the existing transistor is part of a pre-charge circuit.

2. The method of claim 1, wherein detecting the defect is determined based at least in part on analyzing the signal development time for an array of cells comprising the SRAM bitlines;

determining a distribution of a performance of the signal development time for bitlines of the array of cells;

identifying outlier bitlines in the distribution based at least in part on which bitlines fail prematurely relative to other bitlines in the distribution;

programming the variable resistance PCM cell to a conductive state for outlier bitlines;

measuring the signal development time for the outlier bitlines; and re-programming the variable resistance PCM cell based at least in part on the measurement of the outlier bitlines.

3. The method of claim 1, wherein if the defect is determined to pull up the bitline of the SRAM, activating the variable resistance PCM cell coupled to the bitline opposite the bitline having the defect.

4. The method of claim 1, wherein if the defect is determined to pull down the bitline of the SRAM, activating the variable resistance PCM cell coupled to the bitline being pulled down.

5. The method of claim 1, further comprising offsetting, by a dedicated transistor, the defect of the variable resistance PCM cell.

* * * * *